United States Patent [19]
Eldredge

[11] Patent Number: 5,770,953
[45] Date of Patent: Jun. 23, 1998

[54] DESTRUCTIVE READ SENSE-AMP

[75] Inventor: James G. Eldredge, Loveland, Colo.

[73] Assignee: Hewlett-Packard Co., Palo Alto, Calif.

[21] Appl. No.: 785,188

[22] Filed: Jan. 17, 1997

[51] Int. Cl.$^6$ ........................................... G01C 7/06
[52] U.S. Cl. .............................................. 327/54; 327/52
[58] Field of Search ..................... 327/51–57; 365/189.21

[56] References Cited

U.S. PATENT DOCUMENTS

| | | | |
|---|---|---|---|
| 5,015,891 | 5/1991 | Choi .......................................... | 327/53 |
| 5,508,643 | 4/1996 | Khieu ........................................ | 327/52 |
| 5,627,484 | 5/1997 | Tuminaro et al. ......................... | 327/52 |

*Primary Examiner*—Toan Tran

[57] ABSTRACT

A destructive read sense-amp (typically used in SRAM) includes circuitry for disabling its amplifier circuitry in response to a predetermined logic level appearing at its output, circuitry for preserving the predetermined logic level appearing at its output, and circuitry for modifying data carried on data transmission lines connected to its differential inputs. The output preserving means and data modifying circuitry are only enabled while the sense-amp's amplifier circuitry is disabled. In a preferred implementation, the destructive read sense-amp writes a logic "0" into a memory cell upon reading a logic "1" from the same memory cell. The reading and writing of data occurs within a single read cycle.

20 Claims, 4 Drawing Sheets

DESTRUCTIVE READ SENSE-AMP

FIELD OF THE INVENTION

This invention pertains to sense-amps, and more particularly, to a destructive read sense-amp which may be used in static random access memories.

BACKGROUND OF THE INVENTION

A driving factor in the design of static random access memory (SRAM) is size. Smaller memory is advantageous because 1) it consumes less power, 2) it can be accessed faster, and 3) it requires less chip surface area. The size of a SRAM is dependent upon the size of each individual memory cell used to store a single bit of data. As a result, the manufacture of smaller memory requires smaller memory cells. However, very small memory cells have a limited ability to drive current when its data are read. In order to read the very small changes produced on a memory cell's output, a sense-amp is used. A sense-amp is a differential amplifier combined with other gate transistors which is used to detect small changes on the output of memory cells. Conventional sense-amps do not attempt to modify the data contained within a memory cell. However, a need occasionally arises for an SRAM that modifies its data as it is being read.

To modify data in a memory cell in response to the value of data currently stored there, the obvious solution is to address the memory cell, read its data, and then perform a write operation to modify the memory cell's data. However, this operation involves at least two cycles: a read cycle and a write cycle.

It is therefore a primary object of this invention to provide methods and apparatus for reading and modifying data stored in a memory cell, wherein said data reading and data modifying steps are performed during a single memory read cycle.

Another object of this invention is to provide a configuration for a destructive read sense-amp for use in SRAM and the like.

An additional object of this invention is to provide cost-efficient methods and apparatus for reading and modifying stored data.

SUMMARY OF THE INVENTION

In the achievement of the foregoing objects, the inventors have devised a destructive read sense-amp. A destructive read sense-amp is a sense-amp which modifies data contained within a memory cell as the data is read.

A preferred embodiment of such a sense-amp is disclosed below. Specifically, the destructive read sense-amp leaves memory cell data unchanged when a logic "0" is read from a memory cell. If a logic "1" is read from a memory cell, the destructive read sense-amp writes a logic "0" into the memory cell, thereby erasing the logic "1" previously stored in there.

Using a destructive read sense-amp, the problem of reading and modifying data stored in a SRAM during a single read cycle is solved.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 1:
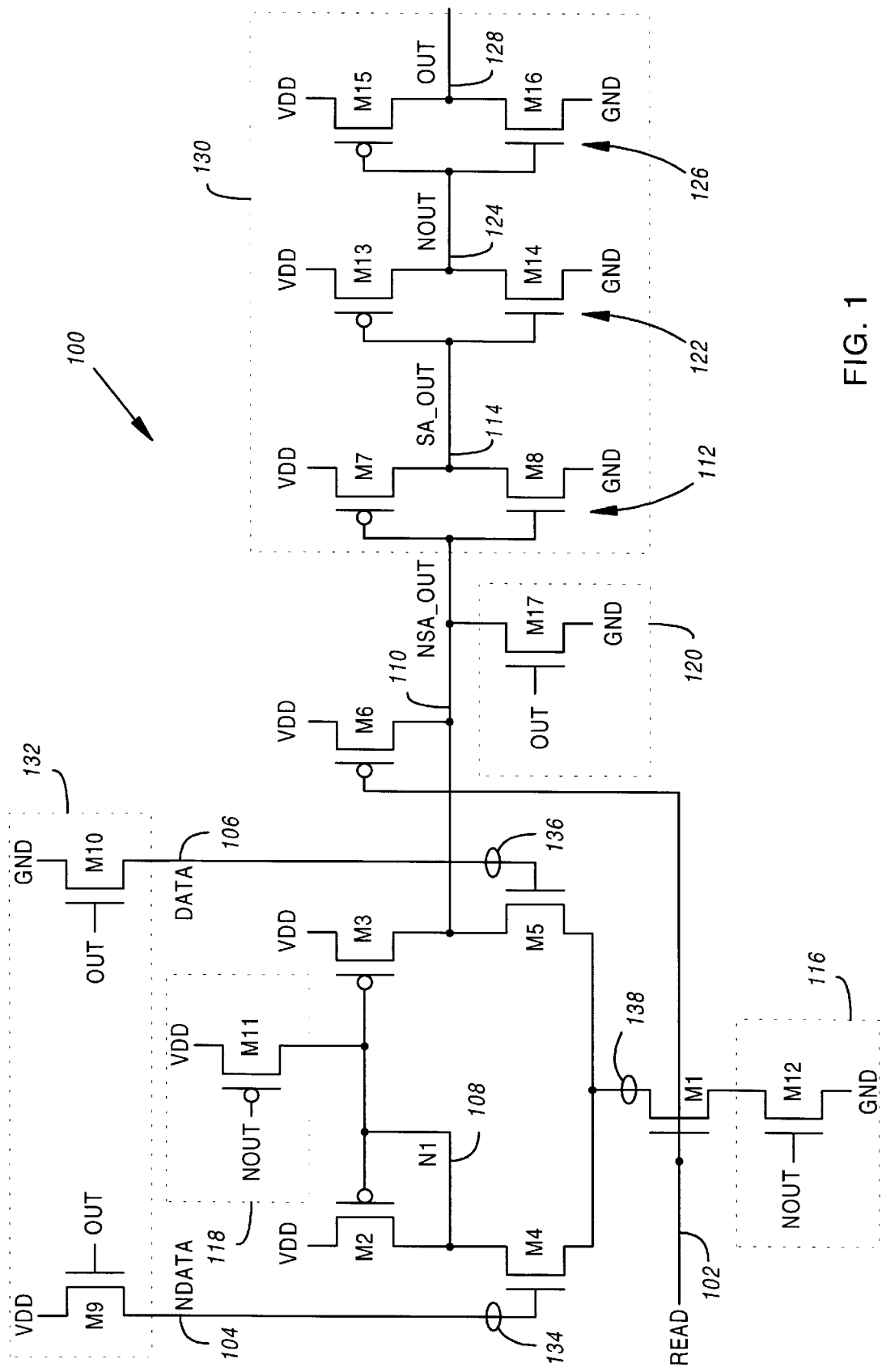
FIG. 1 is a schematic illustrating a destructive read sense-amp.

A destructive read sense-amp 100 is pictured in FIG. 1, and may generally comprise means 116, 118 for disabling its amplifier circuitry in response to a predetermined logic level appearing at its output 110, means 120 for preserving the predetermined logic level appearing at its output 110, and means 132 for modifying data carried on data transmission lines 104, 106 connected to its differential inputs 134, 136. The output preserving means 120 and data modifying means 132 are only enabled while the sense-amp's amplifier circuitry is disabled.

Alternatively, a destructive read sense-amp 100 (FIG. 1) may comprise differential inputs 134, 136 connected to data transmission lines 104, 106, an enable input 138, a reference node 108, a plurality of switches (M9, M10, M11, M12, M17), and a number of inverters 112, 122, 126. The plurality of switches may comprise first and second numbers of switches (M11, M12), a number of feedback loop switches (M17), and a number of data writing switches (M9, M10). The first number of switches may be connected between the sense-amp's enable input 138 and a power rail. The second number of switches may be connected between the sense-amp's reference node 108 and a power rail. The number of feedback loop switches may be connected between the sense-amp's output 110 and a power rail. Each of the number of data writing switches may be connected between a differential input 134, 136 of the sense-amp and a power rail. The number of inverters 112, 122, 126 may be connected to the amplifier's output 110 as a serial inverter string 130, and outputs 124, 128 of the number of inverters 112, 122, 126 may be connected to terminals of the first and second numbers of switches, the feedback loop switches, and the data writing switches.

Consistent with the above apparatus 100, a method of reading and modifying data 300, 302 (FIG. 3) stored in a static random access memory (SRAM) 200 (FIG. 2) may comprise the steps of initiating a read of a sense-amp's differential inputs 134, 136, disabling the sense-amp's differential inputs 134, 136 in response to a predetermined logic level appearing at the sense-amp's output 110, preserving the predetermined logic level appearing at the sense-amp's output 110, and modifying data carried on data transmission lines 104, 106 connected to the sense-amp's differential inputs 134, 136. Preferably, the output preserving and data modifying steps are only performed while the sense-amp's differential inputs 134, 136 are disabled.

Having generally described a destructive read sense-amp 100 and method of reading and modifying data 300, 302 stored in a SRAM 200, the destructive read sense-amp 100 and associated method will now be described in further detail.

Figure 2:
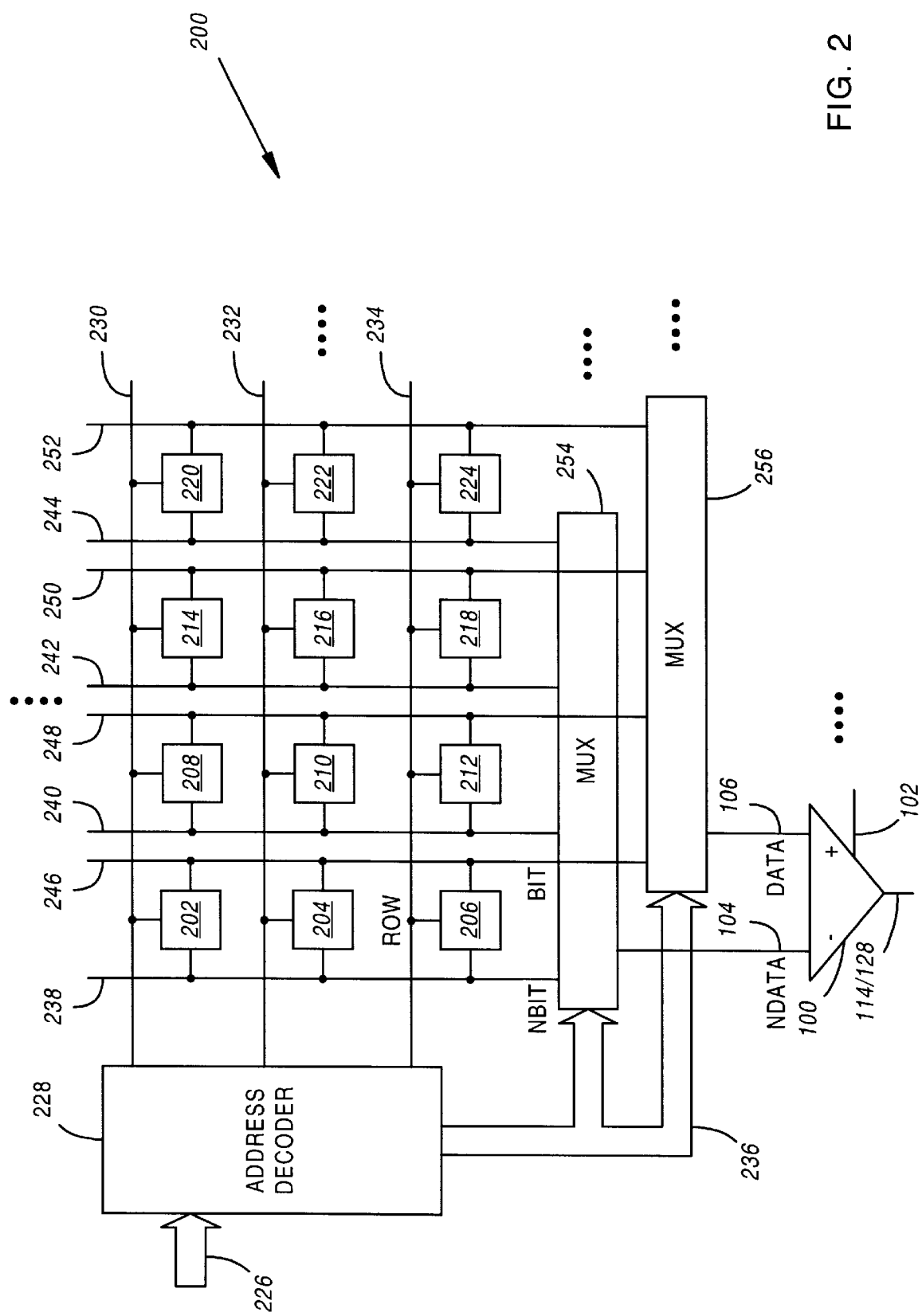
FIG. 2 is a schematic illustrating components of a SRAM in general.

An SRAM 200 is a collection of numerous rows of memory cells 202–224, as illustrated in FIG. 2. Typically, data comprising a single SRAM output bit 110 will be selected from among a grid of many columns 238–252 and rows 230–234 of memory cells 202–224.

Figure 3:
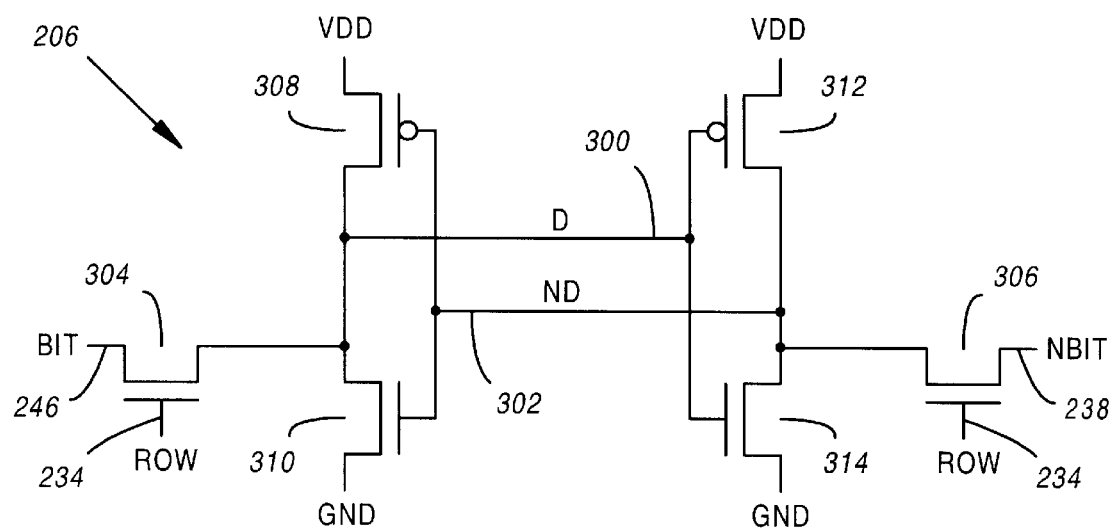
FIG. 3 is a schematic illustrating details of one of the FIG. 2 SRAM memory cells.

A typical memory cell 206 is illustrated in FIG. 3, and comprises a pair of cross coupled inverters (i.e., transistors 308–314). Positive and negative senses of data are held at nodes D 246 and ND 238 until the ROW 234 comprising the memory cell 206 is addressed, and data flows out of the memory cell 206 on differential bit lines BIT 300 and NBIT 302.

When a memory address 226 is supplied to an SRAM's address decoder 228, a row 234 of cells 206, 212, 218, 224 in the SRAM 200 is activated, and data contained in individual cells 206, 212, 218, 224 is driven to differential bit lines 238–252 (denoted BIT 246 and NBIT 238 with respect to memory cell 206 in FIG. 2). Positive 246–252 and negative 238–244 differential data lines are then multiplexed 254, 256 for each bit 114/128 of an SRAM's output, and differential data transmission lines 258, 260 supply the contents of a single SRAM memory cell (i.e., memory cell 206) to a sense-amp 262.

Figure 4:
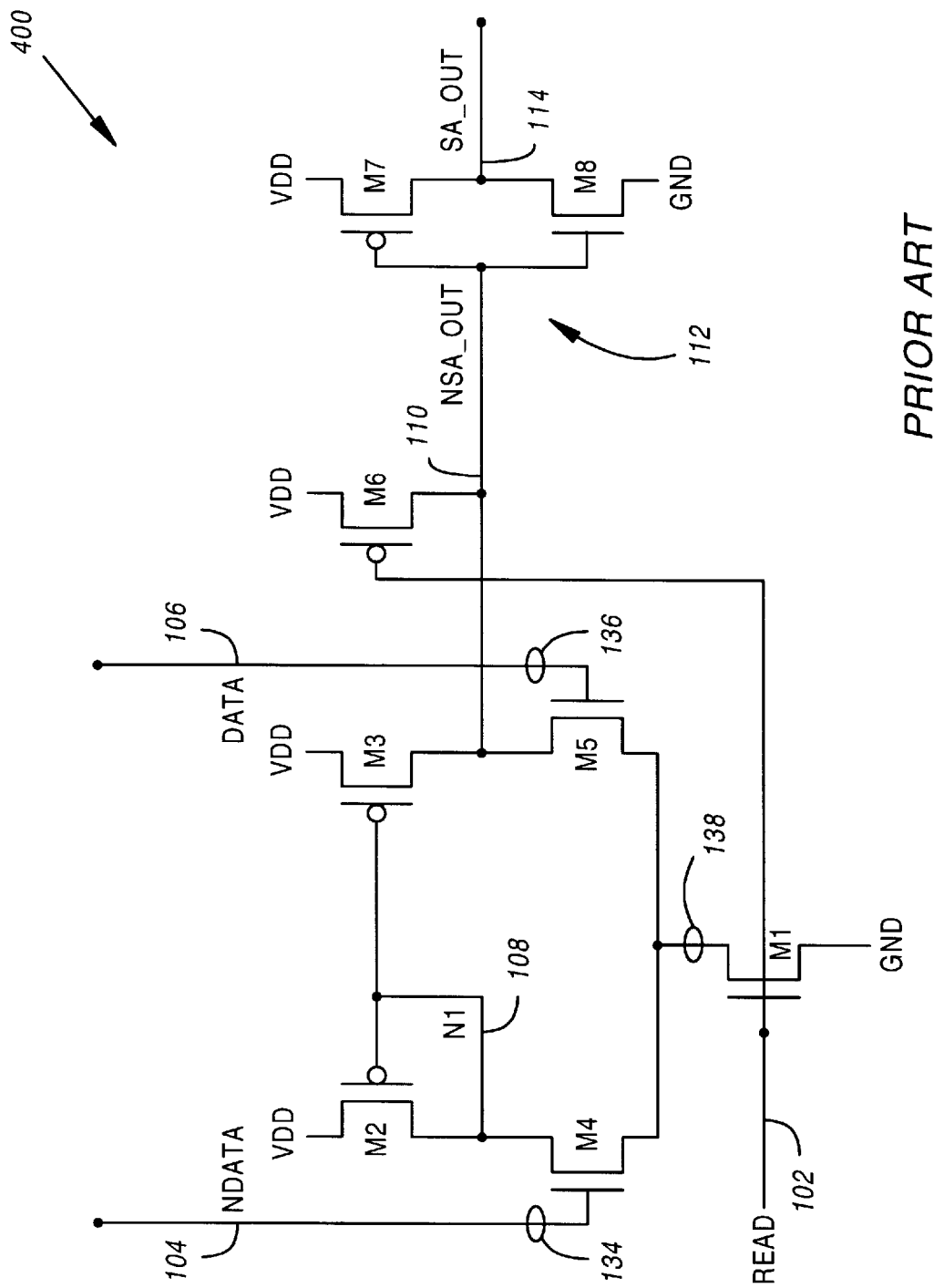
FIG. 4 is a schematic illustrating a conventional SRAM sense-amp.

A sense-amp 400 (FIG. 4) inherently comprises differential inputs 134, 136, an enable input 138, an amplifier (also referred to herein as a "differential amplifier" or "amplifier circuitry"), and an output 110. A conventional sense-amp 400 embodying these basic elements is illustrated in FIG. 4, and comprises transistors M1–M8. A read cycle begins in the sense-amp 400 as an addressed memory cell 206 (FIGS. 2, 3) drives data 300, 302 to data transmission lines DATA 106 and NDATA 104 (via multiplexed bit lines BIT 246 and NBIT 238), and a READ signal 102 is driven to VDD, thereby causing transistor M1 to conduct current. Prior to the initiation of a read cycle, the READ signal 102 is held low (i.e., to ground), and transistor M6 pulls the sense-amp's output (NSA_OUT 110) to VDD (which after an inversion by transistors M7 and M8 produces a low or logic "0" output. As transistor M1 begins to conduct, amplifier circuitry comprising transistors M2, M3, M4 and M5 is enabled. As a small voltage difference arises between DATA 106 and NDATA 104, transistors M4 and M5 begin to conduct different amounts of current, and in turn, create a difference in potential between reference node N1 108 and the sense-amp's output 110. Since the FIG. 4 amplifier is an inverting amplifier, $NSA_{13}$ OUT 110 is inverted again via transistors M7 and M8 (collectively designated as inverter 112) to produce an output ($SA_{13}$ OUT 114) which correctly represents the data 300, 302 stored in an addressed memory cell 206.

For example, consider a read of a logic "1" (wherein the voltage level of NDATA 104 falls with respect to DATA 106). As the READ signal 102 is driven to VDD, transistor M1 (sometimes referred to herein as a "read initiating means") begins to conduct. As transistor M1 begins to conduct, transistor M5 begins to conduct more, causing NSA_OUT 110 to fall. Simultaneously, transistor M4 begins to conduct less, causing the voltage at reference node N1 108 to rise. As the voltage of node N1 108 rises, transistor M3 (the load transistor for transistor M5) also conducts less, and accelerates the fall of NSA_OUT 110. Transistors M7 and M8 invert and amplify NSA_OUT 110 producing a rapid voltage rise on SA_OUT 114. The voltage of SA_OUT 114 therefore indicates that a logic "1" has just been read from memory.

As illustrated in FIG. 1, a destructive read sense-amp 100 may be constructed by expanding upon the structure of a conventional sense-amp 400. In addition to transistors M1–M8 of the conventional FIG. 4 sense-amp, the FIG. 1 destructive read sense-amp further comprises transistors M9–M16. These additional transistors form 1) a means 116, 118 for disabling the sense-amp's amplifier circuitry in response to a predetermined logic level appearing at the sense-amp's output 110; 2) a means 120 for preserving the predetermined logic level appearing at the sense-amp's output 110; and 3) a means 132 for modifying data carried on the data transmission lines 104, 106 connected to the sense-amp's differential inputs 134, 136. The destructive read sense-amp 100 may therefore set, clear, or otherwise affect stored data 300, 302 in the same cycle in which the stored data 300, 302 is read.

In a preferred embodiment of the invention, the means 116, 118 for disabling the sense-amp's amplifier circuitry comprises transistors M11 and M12 (or a number of transistors and/or other components performing substantially the same switching function performed by transistors M11 and M12). Transistor M11 is connected between the sense-amp's reference node, N1 108, and a voltage supply. Transistor M12 is serially connected to transistor M1 (the sense-amp's read initiating means), and the two transistors are then connected between the sense-amp's enable input 138 and ground.

As used in this description, a device "connected" between two points may be one of many devices creating an electrical connection between the two points. Also, as used in this description, "serially connected" transistors are transistors having a single common source/drain connection.

The means 120 for preserving the predetermined logic level appearing at the sense-amp's output 110 may comprise a single feedback transistor, M17, connected between the sense-amp's output 110 and ground (or may again comprise a number of transistors and/or other components performing substantially the same switching function performed by transistor M17).

The means 132 for modifying data carried on the data transmission lines 104, 106 connected to the sense-amp's differential inputs 134, 136 may comprise first and second data modification transistors, M9 and M10, wherein each is connected between a different one of the data transmission lines 104, 106 and a programmed voltage value (e.g., a power rail such as VDD or ground). Again, each of the transistors comprising the data modifying means may be replaced with a number of transistors and/or other components (sometimes referred to in the claims as "data writing switches") performing substantially the same switching functions performed by transistors M9 and M10.

Each of transistors M9–M12 and M17 is driven by an output of a number of inverters 112, 122, 126 connected to the sense-amp's output as a serial inverter string 130. In addition to conventional transistors M7 and M8, the inverter string 130 comprises transistors M13–M16. Inverters 122 and 126 assist in driving NOUT 124 and OUT 128 to respective power rails, and provide sharp digital signals for switching the transistors of the amplifier disabling, output preserving, and data modifying means 116, 118, 120, 132. The additional inverters 122, 126 also create advantageous timing delays.

Note that output NOUT 124 is routed to the gate terminals of the transistors comprising the amplifier disabling means 116, 118, while output OUT 128 is routed to the gate terminals of the transistors comprising the output preserving and data modification means 120, 132.

As earlier mentioned, a destructive read sense-amp 100 may be configured to alter stored data 300, 302 upon a predetermined logic level appearing at the sense-amp's output 110. In FIG. 1, the predetermined logic level is substantially zero volts (i.e., close enough to zero to register a logic "0" at NSA_OUT 110), and the data written to memory upon the occurence of this predetermined logic level is a logic "0". In other words, a logic "0" is written to memory when a logic "1" is read from a bit 128 of the SRAM 200 generated by the FIG. 1 sense-amp 100.

Before a read cycle begins, transistor M6 is pulling NSA_OUT 110 to VDD. This creates the initial output conditions given below:

| Node | Potential |
|------|-----------|
| NSA_OUT | VDD |
| SA_OUT | GND |
| NOUT | VDD |
| OUT | GND |

With NOUT 124 initially at VDD, and while reading a logic "0" from memory, the destructive read sense-amp 100 operates similarly to a conventional sense-amp 400 (i.e., transistors M1–M8 operate in a similar fashion). But consider a read of a logic "1". The logic "1" is read as before. However, as NSA_OUT 110 falls, SA_OUT 114 rises, NOUT 124 falls, and OUT 128 rises. When NOUT 124 falls, the differential amplifier is disabled by transistors M11 and M12. In order to retain the logic "11" value that was read, OUT 128 causes transistor M17 to pull NSA_OUT 110 to GND (thereby creating a feedback loop). With the differential amplifier disabled, and the logic "1" value retained, the data just read may be changed to a logic "0". This occurs when OUT 128 drives the gates of transistors M9 and M10, causing NDATA 104 to be pulled to VDD-$V_t$ (where $V_t$ is the threshold voltage of transistor M9), and DATA 106 to be pulled to GND.

Whether a logic "1" or a logic "0" is read, the initial output conditions of the destructive read sense-amp 100 are reset as the READ signal 102 falls, and transistor M6 pulls NSA_OUT 110 to VDD.

In designing a destructive read sense-amp 100 for a particular use, care should be taken to size transistor M6 larger than transistor M17. In the case where a logic "1" is read, transistor M17 will be pulling NSA_OUT 110 to GND as the read cycle ends. When the READ signal 102 falls, a drive-fight between transistors M6 and M17 ensues. However, if transistor M6 is larger, NSA_OUT 110 is pulled above the trip point of the CMOS inverter 112 composed of transistors M7 and M8. This causes SA_OUT 114 to fall, and the initial output conditions designated above to occur. When OUT 128 falls, transistor M17 turns off and the drive-fight ends.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A destructive read sense-amp, comprising:
   a) means for disabling its amplifier circuitry in response to a predetermined logic level appearing at its output;
   b) means for preserving the predetermined logic level appearing at its output; and
   c) means for modifying data carried on data transmission lines connected to its differential inputs;
   wherein both the output preserving means and data modifying means are enabled only while the sense-amp's amplifier circuitry is disabled.

2. A destructive read sense-amp as in claim 1, further comprising means for initiating a read of its differential inputs, wherein:
   a) the means for disabling the sense-amp's amplifier circuitry comprises:
      i) a first transistor switch, serially connected with the read initiating means between the sense-amp's enable input and ground;
      ii) a second transistor switch connected between the sense-amp's reference node and a voltage supply; and
      iii) a number of inverters, connected to the sense-amp's output as a serial inverter string, wherein a first output of the inverter string is connected to gate terminals of the first and second transistor switches;
   b) the means for preserving the predetermined logic level appearing at the sense-amp's output comprises a feedback transistor connected between the sense-amp's output and ground, wherein a second output of the inverter string is connected to the gate terminal of the feedback transistor; and
   c) the means for modifying data carried on data transmission lines connected to the sense-amp's differential inputs comprises first and second data modification transistors, wherein:
      i) the first data modification transistor is connected between a first of the data transmission lines and a voltage supply;
      ii) the second data modification transistor is connected between a second of the data transmission lines and ground; and
      iii) the second output of the inverter string is connected to the gate terminals of each of the first and second data modification transistors.

3. A destructive read sense-amp as in claim 1, wherein the means for disabling the sense-amp's amplifier circuitry comprises:
   a) a number of transistor switches, wherein each transistor switch is connected between a node of the sense-amp's amplifier circuitry and a power rail; and
   b) a number of inverters, connected to the sense-amp's output as a serial inverter string;
   wherein one or more outputs of the number of inverters are connected to terminals of the number of transistor switches.

4. A destructive read sense-amp as in claim 3, further comprising means for initiating a read of its differential inputs, wherein:
   a) a first of the number of transistor switches is serially connected with the read initiating means; and
   b) the serially connected read initiating means and first transistor switch are connected between the sense-amp's enable input and ground.

5. A destructive read sense-amp as in claim 4, wherein a second of the number of transistor switches is connected between a reference node of the sense-amp and a voltage supply.

6. A destructive read sense-amp as in claim 3, wherein a first of the number of transistor switches is connected between a reference node of the sense-amp and a voltage supply.

7. A destructive read sense-amp as in claim 1, wherein:
   a) the destructive read sense-amp further comprises a number of inverters, connected to the sense-amp's output as a serial inverter string;
   b) the means for preserving the predetermined logic level appearing at the sense-amp's output comprises a number of feedback transistors, connected between the sense-amp's output and a power rail; and c) one or more outputs of the number of inverters are connected to terminals of the number of feedback transistors.

8. A destructive read sense-amp as in claim 7, wherein the number of feedback transistors comprises one feedback transistor connected between the sense-amp's output and ground.

9. A destructive read sense-amp as in claim 1, wherein the means for modifying data carried on data transmission lines connected to the sense-amp's differential inputs comprises:
a) a number of data modification transistors, wherein each data modification transistor is connected to one or more of the data transmission lines; and
b) a number of inverters, connected to the sense-amp's output as a serial inverter string;
wherein one or more outputs of the number of inverters are connected to various of the number of data modification transistors so as to control current flow through the number of data modification transistors.

10. A destructive read sense-amp as in claim 9, wherein each data modification transistor is connected between one of the data transmission lines and a power rail.

11. A destructive read sense-amp as in claim 1, wherein the predetermined logic level is substantially zero volts.

12. A destructive read sense-amp having differential inputs connected to data transmission lines, an enable input, a reference node, and an output, comprising:
a) a first number of switches connected between the sense-amp's enable input and a first power rail;
b) a second number of switches connected between the sense-amp's reference node and a second power rail;
c) a number of feedback loop switches connected between the sense-amp's output and said first power rail;
d) a number of data writing switches, each connected between a differential input of the sense-amp and said first or second power rail; and
e) a number of inverters, connected to the sense-amp's output as a serial inverter string;
wherein outputs of the number of inverters are connected to terminals of the switches comprising the first and second numbers of switches, the feedback loop switches, and the data writing switches.

13. A destructive read sense-amp as in claim 12, wherein:
a) the first number of switches comprises a first switch having a terminal wired to a first output of the number of inverters; and
b) the first switch is serially connected to a second switch having a terminal wired to a sense-amp read line.

14. A destructive read sense-amp as in claim 12, wherein:
a) the number of data writing switches comprises two such switches;
b) each of the data writing switches is connected to a different data transmission line; and
c) each of the data writing switches has a terminal wired to an output of the number of inverters.

15. A destructive read sense-amp as in claim 12, wherein the number of inverters comprises:
a) a twice inverted output connected to switches of the first and second numbers of switches; and
b) a thrice inverted output connected to switches of the feedback loop and data writing switches.

16. A destructive read sense-amp as in claim 12, wherein all of the switches are MOS transistor switches.

17. A method of reading and modifying data stored in a static random access memory during a single read cycle, comprising the steps of:
a) initiating a read of a sense-amp's differential inputs;
b) disabling the sense-amp's differential inputs in response to a predetermined logic level appearing at the sense-amp's output;
c) preserving the predetermined logic level appearing at the sense-amp's output; and
d) modifying data carried on data transmission lines connected to the sense-amp's differential inputs;
wherein said output preserving and data modifying steps are only performed while the sense-amp's differential inputs are disabled.

18. A method as in claim 17, wherein the step of disabling the sense-amp's differential inputs comprises the step of using a signal derived from the sense-amp's output to short one or more nodes of the sense-amp to a constant voltage.

19. A method as in claim 17, wherein the step of preserving the predetermined logic level appearing at the sense-amp's output comprises the step of using a signal derived from the sense-amp's output to trigger a feedback loop at the sense-amp's output.

20. A method as in claim 17, wherein the step of modifying data carried on data transmission lines connected to the sense-amp's differential inputs comprises the step of using a signal derived from the sense-amp's output to drive the data transmission lines to programmed voltage values.

* * * * *